US 6,424,875 B1

(54) METHOD AND CIRCUIT FOR CONTROLLING POWER OF AUDIO PROCESSOR IN MONITOR

(75) Inventor: An-Sung Yoon, Suwon (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/044,012

(22) Filed: Mar. 19, 1998

(30) Foreign Application Priority Data

Mar. 19, 1997 (KR) .............................................. 97-9404

(51) Int. Cl.⁷ ........................... G06F 17/00; H02B 1/00; H04R 29/00; H03G 3/20; G09G 5/00
(52) U.S. Cl. ........................... 700/94; 381/123; 381/58; 381/110; 345/211
(58) Field of Search ................................. 345/211, 212, 345/213; 381/110, 123, 58, 59; 700/94

(56) References Cited

U.S. PATENT DOCUMENTS

| | | | | |
|---|---|---|---|---|
| 5,721,936 A | * | 2/1998 | Kikinis et al. | 395/750.05 |
| 5,736,873 A | * | 4/1998 | Hwang | 327/41 |
| 5,818,299 A | * | 10/1998 | Tran | 381/120 |
| 5,870,086 A | * | 2/1999 | Bang | 345/212 |
| 5,880,719 A | * | 3/1999 | Kikinis | 345/212 |
| 5,889,500 A | * | 3/1999 | Chuang et al. | 345/213 |
| 5,917,479 A | * | 6/1999 | Haapakoski | 345/211 |
| 5,926,172 A | * | 7/1999 | Hanley | 345/210 |
| 5,944,830 A | * | 8/1999 | Hong et al. | 345/211 |
| 5,963,183 A | * | 10/1999 | Takahashi | 345/213 |
| 6,072,883 A | * | 6/2000 | Bae | 381/58 |
| 6,097,378 A | * | 8/2000 | Song | 345/211 |
| 6,108,426 A | * | 8/2000 | Stortz | 381/77 |

* cited by examiner

Primary Examiner—Forester W. Isen
Assistant Examiner—Laura A. Grier
(74) Attorney, Agent, or Firm—Robert E. Bushnell, Esq.

(57) ABSTRACT

A technique for controlling power of an audio processor in a monitor, which processes an audio signal from a computer system and outputs the processed audio signal to a speaker, in which an audio processor power control circuit includes: a power supply circuit for supplying operating power to the audio processor; a microcomputer for controlling an operating mode of the monitor according to an operating mode of the computer system and for adjusting an output volume of the audio processor, and a power switching device, operated under the control of the microcomputer, to supply the operating power from the power supply circuit to the audio processor upon the operating mode of the monitor being in a normal mode or a standby mode and to block the operating power from the power supply circuit to the audio processor upon the operating mode of the monitor being in a suspend mode or a power off mode. The technique has the effect of preventing abnormal oscillation from occurring in the suspend and power off modes and reducing power consumption of the monitor.

10 Claims, 3 Drawing Sheets

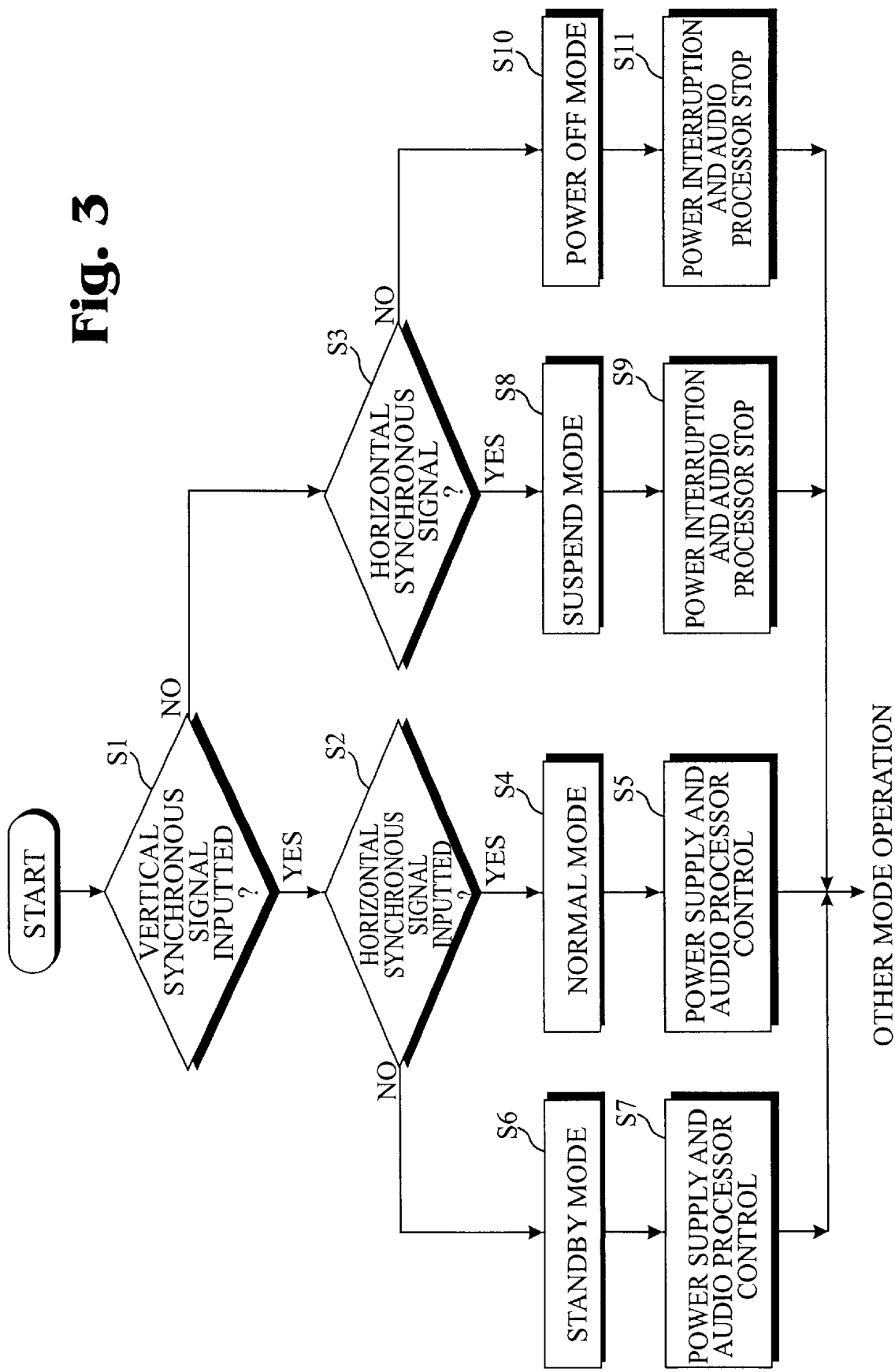

METHOD AND CIRCUIT FOR CONTROLLING POWER OF AUDIO PROCESSOR IN MONITOR

CLAIM OF PRIORITY

This application makes reference to, incorporates the same herein, and claims all benefits accruing under 35 U.S.C. §119 from an application for METHOD AND CIRCUIT FOR CONTROLLING POWER OF AUDIO PROCESSOR IN MONITOR earlier filed in the Korean Industrial Property Office on the 19th of Mar. 1997 and there duly assigned Serial No. 9404/1997.

BACKGROUND OF THE INVENTION

1. Field of the Invention

The present invention relates in general to a monitor which is used as a video display apparatus of a computer system and has an audio signal output function, and more particularly to a technique for controlling power of an audio processor in the monitor, in which the supply of power to the audio processor is controlled according to an operating mode of a display power management system (referred to hereinafter as DPMS).

2. Description of the Related Art

Generally, a monitor utilizes vertical and horizontal synchronous signals to display an output signal from a computer system on its screen.

To this end, the computer system outputs the vertical and horizontal synchronous signals to the monitor, together with data to be displayed on the screen of the monitor.

On the other hand, a relatively large amount of time is required from the turning on of the computer system until the normal operation thereof.

It is likely that the computer system may not be continuously used by the user while it is turned on. For example, with the computer system turned on, the user may take a rest while working or not work for a certain amount of time due to other affairs. In these cases, a large amount of power is unnecessarily consumed.

In order to solve the above-mentioned problem, the computer system checks on the basis of the input of a key signal whether it is being used by the user, and operates in a proper manner in accordance with the checked result. Namely, when the computer system is not being used by the user, it operates sequentially in a normal mode, a standby mode, a suspend mode and a power off mode with the passage of time in which the computer is not being used so as to reduce power consumption. When the computer system is again used by the user, it begins operating again directly in the normal mode.

A DPMS has been proposed by the Video Electronics Standard Association (VESA) in the U.S.A. to manage power of a monitor according to the current mode of the computer system to reduce power consumption.

The DPMS is adapted to manage power to various components of the monitor according to a use state of the computer system. The computer system selectively outputs horizontal and vertical synchronous signals according to an operating mode of the DPMS, and the monitor selectively operates in the normal mode, standby mode, suspend mode and power off mode according to the presence of horizontal and vertical synchronous signals from the computer system.

In other words, the monitor operates in the normal mode when the computer system outputs both the horizontal and vertical synchronous signals. The monitor operates in the standby mode when the computer system outputs only the vertical synchronous signal. Also, the monitor operates in the suspend mode when the computer system outputs only the horizontal synchronous signal. Further, the monitor operates in the power off mode when the computer system does not output either the horizontal synchronous signal or the vertical synchronous signal.

It is commonly prescribed that power consumption of the DPMS be about 80–100 W in the normal mode of the monitor, 65 W or less in the standby mode of the monitor, 25 W or less in the suspend mode of the monitor and 5W or less in the power off mode of the monitor.

On the other hand, with the introduction of multi-media techniques, the computer system comprises an audio card for outputting a desired audio signal, and the monitor inputs the audio signal from the audio card, amplifies the inputted audio signal and outputs the amplified audio signal to a speaker.

To this end, the monitor comprises an audio processor including a pre-amplifier for amplifying an audio signal from the audio card in the computer system, and a power amplifier for amplifying an output signal from the pre-amplifier and outputting the amplified signal to the speaker.

In an earlier circuit for controlling the power of an audio processor in the monitor, the audio processor comprises a preamplifier for amplifying left and right audio signals of left and right channels from the audio card in the computer system in response to a level adjustment signal from an audio level adjustment unit and a power amplifier for amplifying output signals from the preamplifier and outputting the amplified signals to a pair of speakers.

A power supply circuit is adapted to supply operating voltages to the preamplifier and the power amplifier and includes a power supply for supplying alternating current, a diode for rectifying an output AC voltage from the power supply into a direct current and a capacitor for smoothing an output DC voltage from the diode and supplying the smoothed DC voltage as the operating voltages to the preamplifier and the power amplifier.

Normally, the power supply in the power supply circuit is a switching mode power supply which supplies AC power according to the current operating mode. The output AC voltage from the power supply is rectified into a DC voltage by the diode and smoothed by the capacitor and supplied as the operating voltages to the preamplifier and power amplifier.

Under this condition, the left and right channel audio signals from the computer system are applied to the preamplifier and the preamplifier amplifies the signals by an amplification factor which is determined by the audio level adjustment unit.

The left and right audio signals amplified by the preamplifier and further amplified by the amplifier are outputted to the pair of speakers. As a result, the user can listen to the left and right channel audio signals from the computer system through the monitor.

The output power from the power supply circuit is varied according to the operating mode of the monitor used with the audio processor.

When the monitor operates in the normal stand-by mode, the power supply in the power supply circuit normally operates to supply rated voltages to the preamplifier and power amplifier.

However, in the case where the monitor operates in the suspend or power off mode, the output voltage from the power supply is lower than the normal value, resulting in the supply of voltages lower than the rated voltages to the preamplifier and power amplifier.

For this reason, the preamplifier and power amplifier are operated normally in the normal and stand-by modes, but, in the suspend and power off modes, because of the supply of voltages lower than the rated voltages, they may be erroneously operated and a phenomenon such as an abnormal oscillation may occur. These occurrences may be unpleasant to the user.

Furthermore, because voltages lower than the rated voltages are continuously applied to the preamplifier and power amplifier, a large amount of power is unnecessarily consumed even in the suspend and power off modes and as a result, the prescribed power consumption of the DPMS in the suspend and power off modes can not be satisfied.

SUMMARY OF THE INVENTION

Therefore, the present invention has been made in view of the above problems, and it is an object of the present invention to provide a technique for controlling the power of an audio processor in a monitor, in which rated operating power is supplied to the audio processor in normal and standby modes and blocked in suspend and power off modes.

In accordance with one aspect of the present invention, there is provided a method for controlling power of an audio processor in a monitor, comprising the first step of determining an operating mode of the monitor according to the presence of horizontal and vertical synchronous signals from a computer system; and the second step of controlling the supply of operating power to the audio processor according to the operating mode of the monitor determined in the first step.

In accordance with another aspect of the present invention, there is provided a circuit for controlling the power of an audio processor in a monitor, the audio processor processing an audio signal from a computer system and outputting the processed audio signal to a speaker, the circuit comprising: a power supply circuit for supplying operating power to the audio processor; a microcomputer for controlling an operating mode of the monitor according to an operating mode of the computer system and adjusting an output volume of the audio processor; and power switching unit, operated under the control of the microcomputer, to supply the operating power from the power supply circuit to the audio processor upon the operating mode of the monitor being in a normal mode or a standby mode and to block the operating power from the power supply circuit to the audio it processor upon the operating mode of the monitor being in a suspend mode or a power off mode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3 is a flowchart illustrating the operation of a microcomputer in FIG. 2 in accordance with the present invention.

DETAILED DESCRIPTION OF THE PREFERRED EMBODIMENTS

Figure 1:
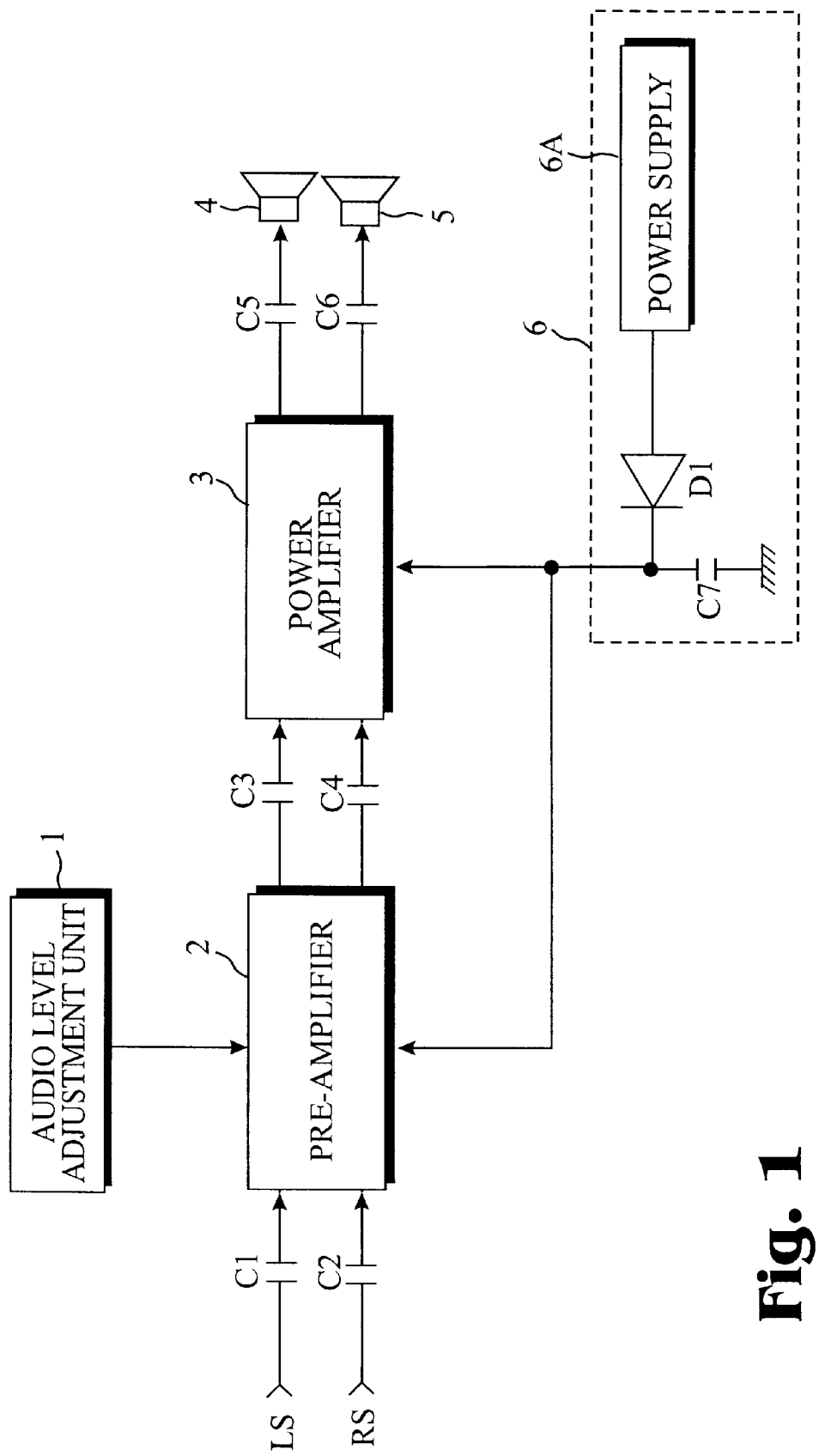
FIG. 1 is a circuit diagram illustrating the construction of an earlier circuit for controlling power of an audio processor in a monitor.

FIG. 1 is a circuit diagram illustrating the construction of an earlier circuit for controlling power of the audio processor in the monitor. The audio processor power control circuit is adapted to control the supply of operating power to the audio processor.

In FIG. 1, the audio processor comprises a pre-amplifier 2 for amplifying audio signals LS and RS of left (L) and right (R) channels from the audio card in the computer system in response to a level adjustment signal from an audio level adjustment unit 1, and a power amplifier 3 for amplifying output signals from the pre-amplifier 2 and outputting the amplified signals to speakers 4 and 5, respectively.

A power supply circuit 6 is adapted to supply operating voltages to the pre-amplifier 2 and power amplifier 3. To this end, the power supply circuit 6 includes a power supply 6A for supplying alternating current (referred to hereinafter as AC) power, a diode D1 for rectifying an output AC voltage from the power supply 6A into a direct current (referred to hereinafter as DC) voltage, and a capacitor C7 for smoothing an output DC voltage from the diode D1 and supplying the smoothed DC voltage as the operating voltages to the pre-amplifier 2 and power amplifier 3.

The reference numerals C1–C6, not described, designate capacitors for passing the audio signals, respectively.

The operation of the earlier audio processor power control circuit with the above-mentioned construction will hereinafter be described.

The power supply 6A in the power supply circuit 6 is typically a switching mode power supply (SMPS) which supplies AC power according to the current operating mode. The output AC voltage from the power supply 6A is rectified into a DC voltage by the diode D1, smoothed by the capacitor C7 and supplied as the operating voltages to the pre-amplifier 2 and power amplifier 3.

Under this condition, L and R channel audio signals LS and RS from the computer system are applied to the pre-amplifier 2, respectively, through the capacitors C1 and C2. The pre-amplifier 2 amplifies the applied L and R channel audio signals LS and RS by an amplification factor which is determined by the audio level adjustment unit 1.

The audio level adjustment unit 1 typically employs a variable resistor to adjust the levels of the L and R channel audio signals LS and RS.

The L and R channel audio signals LS and RS amplified by the pre-amplifier 2 are applied to the power amplifier 3, respectively, through the capacitors C3 and C4. The power amplifier 3 amplifies the applied L and R channel audio signals LS and RS and outputs the amplified L and R channel audio signals LS and RS to the speakers 4 and 5 through the capacitors C5 and C6, respectively. As a result, the user can listen to the L and R channel audio signals LS and RS from the computer system through the monitor.

The output power from the power supply circuit 6 is varied according to the operating mode of the monitor used with the audio processor.

In other words, when the monitor operates in the normal or standby mode, the power supply 6A in the power supply circuit 6 normally operates to supply rated voltages to the pre-amplifier 2 and power amplifier 3.

However, in the case where the monitor operates in the suspend or power off mode, the output voltage from the power supply 6A is lower than the normal value, resulting in the supply of voltages lower than the rated voltages to the pre-amplifier 2 and power amplifier 3.

For this reason, the pre-amplifier 2 and power amplifier 3 are operated normally in the normal and standby modes, but, in the suspend and power off modes, because of the supply of voltages lower than the rated voltages, they may be erroneously operated and a phenomenon such as an abnormal oscillation may occur. These occurrences may be unpleasant to the user.

Further, because voltages lower than the rated voltages are continuously applied to the pre-amplifier 2 and power amplifier 3, a large amount of power is unnecessarily consumed even in the suspend and power off modes. As a result, the prescribed power consumption of the DPMS in the suspend and power off modes cannot be satisfied.

Figure 2:
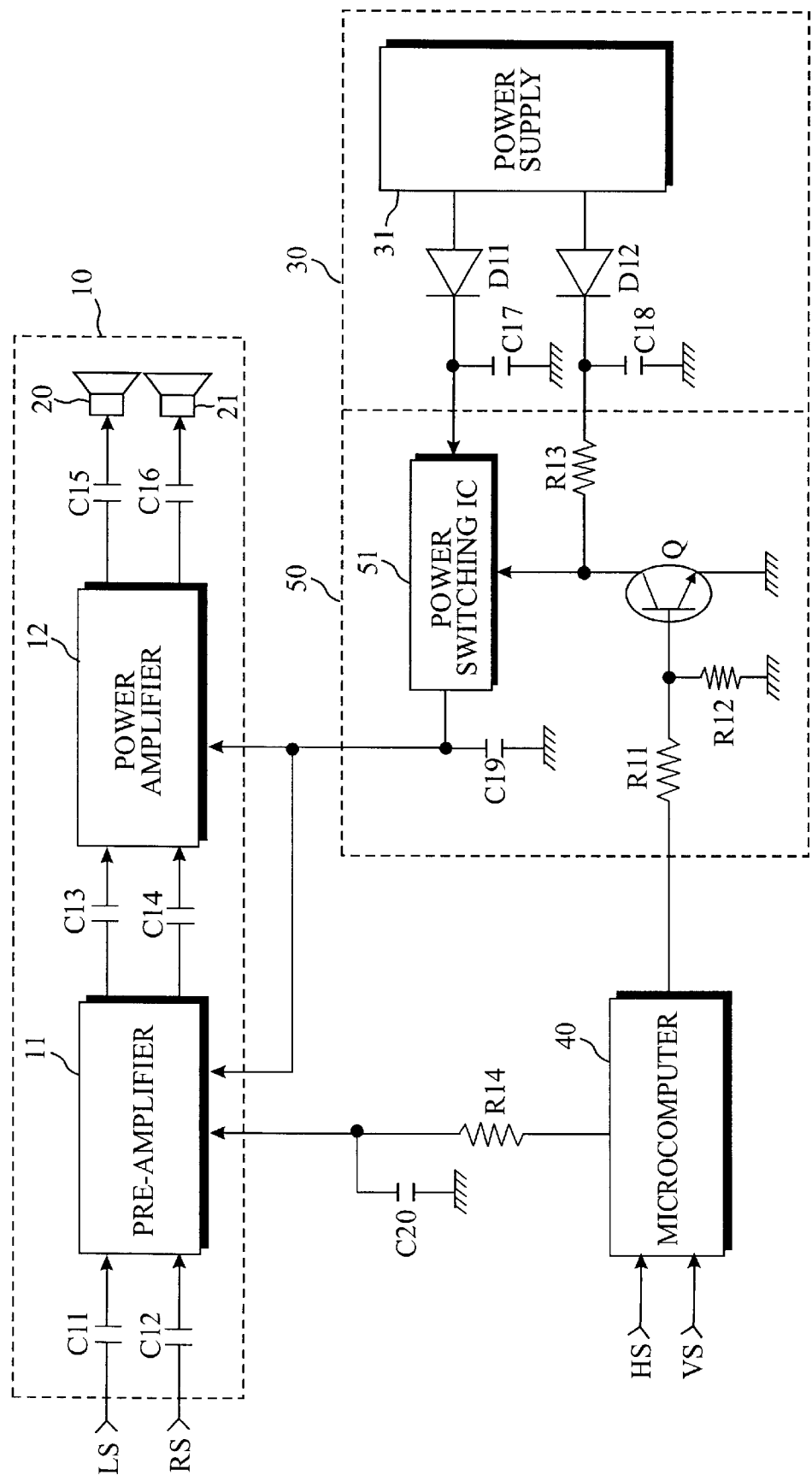
FIG. 2 is a circuit diagram illustrating the construction of a circuit for controlling power of an audio processor in a monitor in accordance with the present invention.

FIG. 2 is a circuit diagram illustrating the construction of a circuit for controlling power of an audio processor in a monitor in accordance with the present invention. In this drawing, the reference numeral 10 designates the audio processor which processes L and R channel audio signals LS and RS from an audio card in a computer system and outputs the processed audio signals to speakers 20 and 21, respectively.

A power supply circuit 30 is adapted to supply operating power to the audio processor 10.

A microcomputer 40 is adapted to control an operating mode of the monitor according to the presence of horizontal and vertical synchronous signals HS and VS from the computer system.

A power switching device 50 is operated under the control of the microcomputer 40 to supply the operating power from the power supply circuit 30 to the audio processor 10 in normal and standby modes and to block the operating power from the power supply circuit 30 to the audio processor 10 in suspend and power off modes.

The audio processor 10 includes a pre-amplifier 11 for amplifying the L and R channel audio signals LS and RS from the computer system by a predetermined level, and a power amplifier 12 for amplifying output signals from the pre-amplifier 11 and outputting the amplified signals to the speakers 20 and 21, respectively.

The power supply circuit 30 includes a power supply 31 for outputting an AC voltage it according to an operating mode of a DPMS, a diode D11 and a capacitor C17 for cooperating to convert the output AC voltage from the power supply 31 into a DC voltage and output the converted DC voltage as a first operating voltage, and a diode D12 and a capacitor C18 for cooperating to convert the output AC voltage from the power supply 31 into a DC voltage and output the converted DC voltage as a second operating voltage.

The power switching device 50 includes a transistor Q having its base connected to a control signal output terminal of the microcomputer 40 through resistors R11 and R12, its collector connected to a second operating voltage output terminal of the power supply circuit 30 through a resistor R13 and its emitter connected to a ground voltage terminal, and a power switching integrated circuit (IC) 51 having its input terminal connected to a first operating voltage output terminal of the pre-amplifier 11 are applied to the power amplifier 12, respectively, through the capacitors C13 and C14. The power amplifier 12 amplifies the applied L and R channel audio signals LS and RS and outputs the amplified L and R channel audio signals LS and RS to the speakers 20 and 21 through the capacitors C15 and C16, respectively.

Also, the volume control signal from the microcomputer 40 is applied to the pre-amplifier 11 through the resistor R14, thereby allowing the pre-amplifier 11 to adjust the volumes of the L and R channel audio signals LS and RS.

On the other hand, in the case where the vertical synchronous signal VS is being inputted and the horizontal synchronous signal HS is not being inputted, the microcomputer 40 determines at step S6 that the current operating mode of the monitor is the standby mode. As a result, at step S7, the microcomputer 40 outputs a low level signal to the power switching device 50 at its control signal output terminal so that the first operating voltage from the power supply circuit 30 can be applied to the pre-amplifier 11 and power amplifier 12 in the audio processor 10 to operate them normally. Also at step S7, the microcomputer 40 controls the operation of the audio processor 10.

In the case where the vertical synchronous signal VS is not being inputted and the horizontal synchronous signal HS is being inputted, the microcomputer 40 determines at step S8 that the current operating mode of the monitor is the suspend mode. As a result, at step S9, the microcomputer 40 outputs a high level signal to the power switching device 50 at its control signal output terminal so that the first operating voltage from the power supply circuit 30 cannot be applied to the pre-amplifier 11 and power amplifier 12 in the audio processor 10. Also at step S9, the microcomputer 40 stops the operation of the audio processor 10. power supply circuit 30, its output terminal connected in common to a capacitor C19 and operating voltage input terminals of the pre-amplifier 11 and power amplifier 12 in the audio processor 10 and its control terminal connected to a connection point of the collector of the transistor Q and the resistor R13.

The reference numerals R14 and C20, not described, designate respectively a resistor and a capacitor for cooperating to transfer a volume control signal from the microcomputer 40 to the pre-amplifier 11 in the audio processor 10.

The reference numerals C11–C16, not described, designate capacitors for passing the audio signals, respectively.

The operation of the audio processor power control circuit with the above-mentioned construction in accordance with the present invention will hereinafter be described in detail with reference to FIG. 3.

FIG. 3 is a flowchart illustrating the operation of the microcomputer 40 in FIG. 2 in accordance with the present invention. First, the output AC voltage from the power supply 31 in the power supply circuit 30 is rectified into a DC voltage by the diode D11, smoothed by the capacitor C17 and supplied as the first operating voltage. Also, the output AC voltage from the power supply 31 is rectified into a DC voltage by the diode D12, smoothed by the capacitor C18 and supplied as the second operating voltage.

Under this condition, the microcomputer 40 determines the current operating mode of the monitor according to the presence of the horizontal and vertical synchronous signals HS and VS from the computer system.

Namely, as shown in FIG. 3, the microcomputer 40 checks at step S1 whether the vertical synchronous signal VS from the computer system is being inputted and then checks at steps S2 and S3 whether the horizontal synchronous signal HS from the computer system is being inputted.

In the case where both the vertical and horizontal synchronous signals VS and HS from the computer system are being inputted, the microcomputer 40 determines at step S4 that the current operating mode of the monitor is the normal mode. As a result, at step S5, the microcomputer 40 outputs a low level signal to the power switching device 50 at its control signal output terminal so that the first operating voltage from the power supply circuit 30 can be applied to the pre-amplifier 11 and power amplifier 12 in the audio processor 10 to operate them normally. Also at step S5, the microcomputer 40 controls the operation of the audio processor 10.

In other words, in the case where the current operating mode of the monitor is the normal mode, the microcomputer 40 outputs a low level signal to the power switching device 50 to turn off the transistor Q therein. Then, in the power switching device 50, a high level signal is applied to the power switching IC 51 because of the turned-off state of the transistor Q. In response to the high level signal, the power switching IC 51 is operated to transfer the first operating voltage from the power supply circuit 30 to the pre-amplifier 11 and power amplifier 12 in the audio processor 10.

As a result, the pre-amplifier 11 and power amplifier 12 in the audio processor 10 are normally operated. Namely, the L and R channel audio signals LS and RS from the computer system are applied to the pre-amplifier 11, respectively, through the capacitors C11 and C12 and amplified by the pre-amplifier 11. The L and R channel audio signals LS and RS amplified by the In other words, in the case where the current operating mode of the monitor is the suspend mode, the microcomputer 40 outputs a high level signal to the power switching device 50 to turn on the transistor Q therein. Then, in the power switching device 50, the second operating voltage from the power supply circuit 30 is transferred to the ground voltage terminal through the resistor R13 and transistor Q, thereby causing a low level signal to be applied to the power switching IC 51. As a result, the power switching IC 51 is not operated.

As the power switching IC 51 is not operated, the first operating voltage from the power supply circuit 30 is not applied to the pre-amplifier 11 and power amplifier 12 in the audio processor 10. In result, the audio processor 10 is not operated.

In the case where neither the horizontal synchronous signal HS nor the vertical synchronous signal VS is being inputted, the microcomputer 40 determines at step S10 that the current operating mode of the monitor is the power off mode. As a result, at step S11, the microcomputer 40 outputs a high level signal to the power switching device 50 at its control signal output terminal so that the first operating voltage from the power supply circuit 30 cannot be applied to the pre-amplifier 11 and power amplifier 12 in the audio processor 10. Also at step S11, the microcomputer 40 stops the operation of the audio processor 10.

As apparent from the above description, according to the present invention, the supply of operating power to the audio processor is controlled depending on the power supply mode of the monitor. Namely, in the normal and standby modes of the monitor, the audio signal from the computer system can normally be amplified and outputted by the audio processor. However, in the suspend and power off modes of the monitor, the audio processor is not operated because of the power interruption. Therefore, the present invention has the effect of preventing abnormal oscillation from occurring and satisfying the prescribed power consumption of the DPMS in the suspend and power off modes.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for controlling power of an audio processor in a monitor, comprising the steps of:
   determining an operating mode of said monitor according to a presence of a horizontal synchronous signal and according to a presence of a vertical synchronous signal from a computer system; and
   selectively controlling the supply of operating power to said audio processor according to the operating mode of said monitor determined in the step of determining an operating mode by normally supplying the operating power to said audio processor when the operating mode of said monitor is determined as one of a normal mode and a standby mode and by blocking the operating power to said audio processor when the operating mode of said monitor is determined as one of a suspend mode and a power off mode.

2. The method for controlling power of an audio processor in a monitor, as set forth in claim 1, further comprised of the step of determining an operating mode comprising determining the operating mode of said monitor to be the normal mode in the presence of both the horizontal synchronous signal and the vertical synchronous signal from the computer system and determining the operating mode to be the standby mode in the presence of only the vertical synchronous signal from the computer system and determining the operating mode to be the suspend mode in the presence of only the horizontal synchronous signal from the computer system and determining the operating mode to be the power off mode in the presence of neither the horizontal synchronous signal nor the vertical synchronous signal.

3. A circuit for controlling power of an audio processor in a monitor, said audio processor processing an audio signal from a computer system and outputting the processed audio signal to a speaker, the circuit comprising:
   a power supply circuit for supplying operating power to said audio processor;
   a microcomputer for controlling an operating mode of said monitor according to a presence of a horizontal synchronous signal and according to a presence of a vertical synchronous signal from said computer system, and for adjusting an output volume of said audio processor; and
   a power switching means, operated under the control of said microcomputer according to the operating mode of said monitor, to selectively supply the operating power from said power supply circuit to said audio processor upon the operating mode of said monitor being in one of a normal mode and a standby mode and to selectively block the operating power from said power supply circuit to said audio processor upon the operating mode of said monitor being in one of a suspend mode and a power off mode.

4. The circuit for controlling power of an audio processor in a monitor, as set forth in claim 3, further comprised of said power switching means comprising:
   a transistor for inverting a control signal from said microcomputer, the control signal from said microcomputer corresponding to the operating mode of said monitor; and
   a power switching circuit for selectively supplying and blocking the operating power from said power supply circuit to said audio processor in response to an output signal from said transistor, the output signal from said transistor corresponding to the control signal from said microcomputer.

5. The circuit for controlling power of an audio processor in a monitor, as set forth in claim 4, further comprised of the microcomputer determining the operating mode of said monitor to be the normal mode in the presence of both the horizontal synchronous signal and the vertical synchronous signal from the computer system and determining the operating mode to be the standby mode in the presence of only the vertical synchronous signal from the computer system and determining the operating mode to be the suspend mode in the presence of only the horizontal synchronous signal from the computer system and determining the operating mode to be the power off mode in the presence of neither the vertical synchronous signal nor horizontal synchronous signal.

6. The circuit for controlling power of an audio processor in a monitor, as set forth in claim 3, further comprised of the microcomputer determining the operating mode of said monitor to be the normal mode in the presence of both the horizontal synchronous signal and the vertical synchronous signal from the computer system and determining the operating mode to be the standby mode in the presence of only the vertical synchronous signal from the computer system and determining the operating mode to be the suspend mode in the presence of only the horizontal synchronous signal from the computer system and determining the operating mode to be the power off mode in the presence of neither the vertical synchronous signal nor the horizontal synchronous signal.

7. A circuit for controlling power of an audio processor in a monitor, said audio processor processing an audio signal from a computer system and outputting the processed audio signal to a speaker, the circuit comprising:

a power supply circuit for supplying operating power to said audio processor, said power supply circuit outputting a first voltage and a second voltage, said first voltage corresponding to the operating power supplied to said audio processor;

a microcomputer for controlling an operating mode of said monitor according to a presence of a horizontal synchronous signal and according to a presence of a vertical synchronous signal from said computer system, and for adjusting an output volume of said audio processor; and a power switching means, operated under the control of said microcomputer according to the operating mode of said monitor, to selectively supply the operating power from said power supply circuit to said audio processor upon the operating mode of said monitor being in one of a normal mode and a standby mode and to selectively block the operating power from said power supply circuit to said audio processor upon the operating mode of said monitor being in one of a suspend mode and a power off mode, said power switching means operating to selectively transfer said second voltage from said power supply circuit to selectively block supply of the operating power from said first voltage of said power supply circuit to said audio processor.

8. The circuit for controlling power of an audio processor in a monitor, as set forth in claim 7, further comprised of said power switching means comprising:

a transistor for inverting a control signal from said microcomputer, the control signal from said microcomputer corresponding to the operating mode of said monitor; and a power switching circuit for selectively supplying and blocking the operating power from said power supply circuit to said audio processor in response to an output signal from said transistor, the output signal from said transistor corresponding to the control signal from said microcomputer.

9. The circuit for controlling power of an audio processor in a monitor, as set forth in claim 8, further comprised of the microcomputer determining the operating mode of said monitor to be the normal mode in the presence of both the horizontal synchronous signal and the vertical synchronous signal from the computer system and determining the operating mode to be the standby mode in the presence of only the vertical synchronous signal from the computer system and determining the operating mode to be the suspend mode in the presence of only the horizontal synchronous signal from the computer system and determining the operating mode to be the power off mode in the presence of neither the vertical synchronous signal nor the horizontal synchronous signal.

10. The circuit for controlling power of an audio processor in a monitor, as set forth in claim 7, further comprised of the microcomputer determining the operating mode of said monitor to be the normal mode in the presence of both the horizontal synchronous signal and the vertical synchronous signal from the computer system and determining the operating mode to be the standby mode in the presence of only the vertical synchronous signal from the computer system and determining the operating mode to be the suspend mode in the presence of only the horizontal synchronous signal from the computer system and determining the operating mode to be the power off mode in the presence of neither the vertical synchronous signal nor the horizontal synchronous signal.

* * * * *